United States Patent [19]
Kimura et al.

[11] Patent Number: 5,276,368
[45] Date of Patent: Jan. 4, 1994

[54] FREQUENCY DISCRIMINATOR

[75] Inventors: Katsuji Kimura; Tetsuya Okuzumi, both of Tokyo, Japan

[73] Assignee: NEC Corporation, Tokyo, Japan

[21] Appl. No.: 890,156

[22] Filed: May 29, 1992

[30] Foreign Application Priority Data

May 31, 1991 [JP] Japan ................. 3-155154

[51] Int. Cl.$^5$ ................. H03D 3/00; H03K 9/06
[52] U.S. Cl. ................. 307/522; 307/529; 328/140
[58] Field of Search ................. 307/522, 510, 524, 271; 328/140, 141, 139, 138, 156

[56] References Cited

U.S. PATENT DOCUMENTS

| | | | |
|---|---|---|---|
| 4,119,919 | 10/1978 | Sugawara | 307/522 |
| 4,426,622 | 1/1984 | Rittenbach | 328/141 |
| 4,451,792 | 5/1984 | Gay | 307/510 |
| 4,775,843 | 10/1988 | Wilcox . | |

FOREIGN PATENT DOCUMENTS 0071294 7/1982 European Pat. Off. .
3210683 9/1991 Japan .

*Primary Examiner*—Timothy P. Callahan
*Attorney, Agent, or Firm*—Sughrue, Mion, Zinn, Macpeak & Seas

[57] ABSTRACT

A frequency discriminator is provided which comprises a phase shifter for shifting a phase of an IF signal, a multiplier for analogically multiplying the IF signal and an output signal of the phase shifter and outputting the resultant signal thus obtained as a differential current, a circuit for forming a differential current of a differential output current of the multiplier, an inverter circuit to be driven by the differential current thus formed, and a low-pass filter for integrating an output signal of the inverter circuit. As the circuit for forming the differential current thereof, a current mirror circuit is preferably used. Thus, a quadrature-type frequency discriminator can be realized on a C-MOS integrated circuit.

10 Claims, 2 Drawing Sheets

FREQUENCY DISCRIMINATOR

BACKGROUND OF THE INVENTION

1. Field of the Invention

This invention relates to a frequency discriminator and more particularly, to a frequency discriminator which is adapted to be formed on a C-MOS integrated circuit.

2. Description of the Related Art

A quadrature-type frequency discriminator uses an analog multiplier and is conventionally formed on a bipolar integrated circuit in general. This means that such a quadrature-type frequency discriminator that is to be formed on a C-MOS integrated circuit is not known previously. On the other band, a conventional frequency discriminator that is to be formed on a C-MOS integrated circuit uses a pulse count or phase-locked loop (PLL) type one which is formed of a digital circuit.

Recently, a quadrature-type frequency discriminator to be formed on a C-MOS integrated circuit has been largely demanded to be developed in order to make the best use of advantages of a C-MOS integrated circuit. This invention was made to meet such demand as above, an object of this invention is to provide a frequency discriminator capable of being formed on a C-MOS integrated circuit without arising any disadvantageous problem.

SUMMARY OF THE INVENTION

A frequency discriminator according to this invention comprises a phase shifter for shifting a phase of a modulated signal, an analog multiplier for analogically multiplying the modulated signal and on output signal of the phase shifter and outputting the resultant signal thus obtained as a differential current, a circuit for forming a differential current of a differential output current outputted from the analog multiplier, an inverter circuit to be driven by the differential current thus formed, and a low-pass filter for integrating an output signal of the inverter circuit and removing the carrier component thereof.

The frequency discriminator of this invention is equipped with the inverter circuit which is driven by the differential current of the differential output current of the multiplier between the analog multiplier and the low-pass filter for removing the carrier component thereof. As a result, if the polarity of the differential current thus formed is varied, for example, from a positive (+) to a negative (−), the output signal of said inverter circuit is responsively inverted from the H-level to the L-level or vice verse. Thus, even when said differential current is varied infinitesimally, such variation can be converted into the difference between the H-level and L-level of the inverter circuit, so that the demodulated output level can be increased in response to the difference therebetween. Consequently, the frequency discriminator of this invention is difficult to be subjected to the influence of 1/f noise of an MOS transistor.

In addition, the direct-current operating point of the inverter circuit is determined by the duty of the waveform of its output signal, which means that there is no possibility to vary the direct-current operating point due to variation in circuit characteristic in production process. Further in addition, the inverter circuit is to be driven by the differential current of the differential output current of the multiplier, which means that there is no possibility to vary either the direct-current operating point or the demodulated signal level due to variation in ambient temperature.

Consequently, according to this invention, a quadrature type frequency discriminator superior in applicability can be realized on a C-MOS integrated circuit without arising any disadvantageous problem.

On the C-MOS integrated circuit, an MOS transistor is small in transconductance as well as small in driving ability, which means that if it is subjected to a resistance load, the operating frequency cannot be expanded, resulting in arising such a disadvantage that the circuit current is increased. On the other hand, the frequency discriminator of this invention is equipped with the inverter circuit as shown above in order to provide an active load as well as to provide its output as an electric current, thus being capable of overcoming the above-mentioned disadvantageous problem.

In a preferred embodiment of this invention, a current mirror circuit is used as the circuit for forming the differential current, being particularly preferable to be used three current mirror circuits. When the circuit for forming the differential current comprises three current mirror circuits, or a first, second and third circuits, it is preferable that the multiplier receives or sends out an electric current through one of the transistors forming the first current mirror circuit and one of the transistors forming the second current mirror circuit, and yet a differential current formed by the circuit is sent through the third current mirror circuit to the inverter circuit or is sent from the inverter circuit through the third current mirror circuit to the multiplier.

As the inverter circuit, an arbitrarily structured circuit can be employed, in this case, however, it is preferable to have a C-MOS structure. As the low-pass filter, an RC active filter is preferable to be used due to the fact that the load of the inverter circuit can be lightened.

In the frequency discriminator of this invention, a delay circuit can be employed instead of the phase shifter, which delays the phase of a modulated signal. In the case of using the phase shifter, a quadrature-type frequency discriminator for general use can be obtained, and in the case of using the delay circuit, the multiplicative detector action can be characteristically obtained.

DESCRIPTION OF THE PREFERRED EMBODIMENTS

Figure 1:
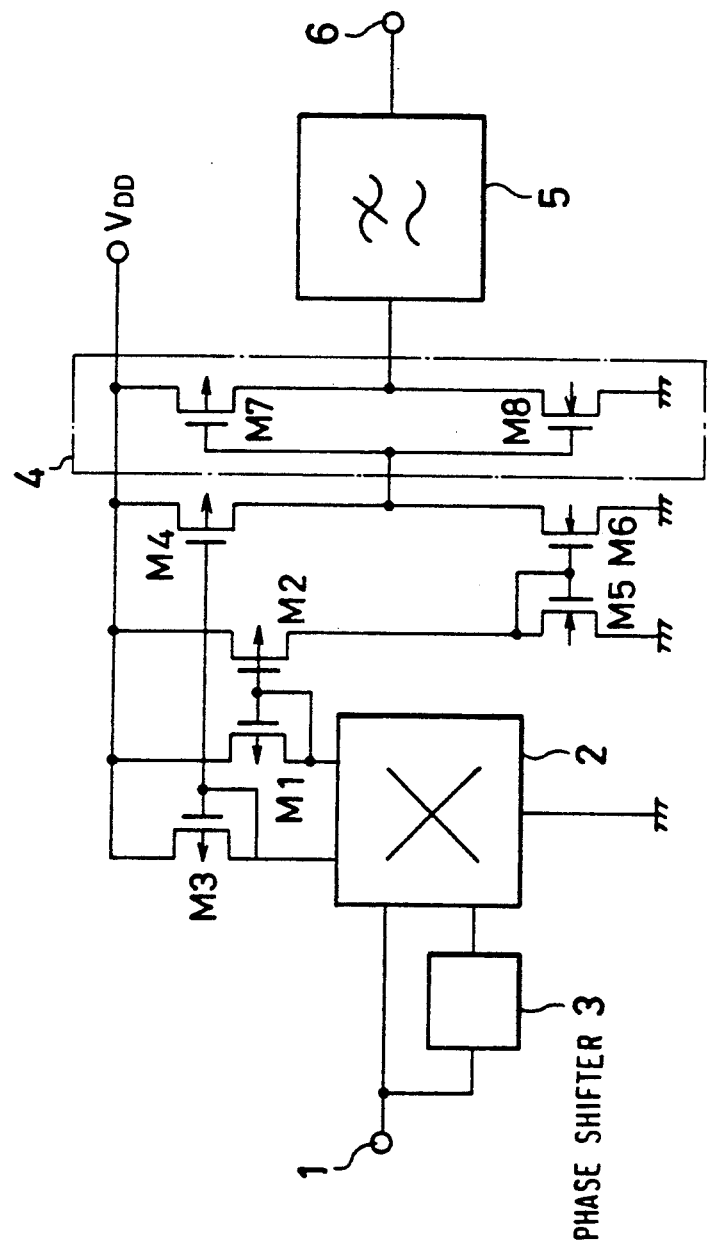
FIG. 1 is a circuit diagram of a frequency discriminator according to a first embodiment of this invention.

Preferred embodiments of this invention will be described below while referring to the drawings attached.

First Embodiment

FIG. 1 shows a frequency discriminator according to a first embodiment of this invention, which comprises an analog multiplier 2, a phase shifter 3, a first current mirror circuit consisting of p-channel MOS transistors M1 and M2, a second current mirror circuit consisting of p-channel MOS transistors M3 and M4, a third current mirror circuit consisting of n-channel MOS transistors M5 and M6, an inverter circuit 4 consisting of a p-channel MOS transistor M7 and a n-channel MOS transistor M8 and a low-pass filter 5. In FIG. 1, the reference numeral 1 indicates an input terminal for receiving a modulated intermediate-frequency (IF) signal and the reference numeral 6 indicates an output terminal for outputting a demodulated signal.

The phase shifter 3 receives a modulated IF signal from the input terminal 1 to shift the phase thereof by $90° \pm \Delta\phi$ in response to the frequency. The IF signal thus phase-shifted is sent to the multiplier 2 through one input terminal of the multiplier 2. As the phase shifter 3, any circuit can be employed if it shifts the phase of an input signal in response to the frequency thereof.

On the other hand, the analog multiplier 2 receives the modulated IF signal directly from the input terminal 1 of this discriminator circuit through the other terminal of the multiplier 2. As a result, the multiplier 2 multiplies the modulated IF signal thus directly inputted from the terminal 1 and the IF signal thus phase-shifted by the phase-shifter 3 and outputs the resultant signal thus obtained as a differential current through an output terminal pair. As the multiplier 2, any circuit can be employed, if it outputs such a resultant signal as is obtained by multiplication as a differential current through an output terminal pair. For example, it is preferable to employ a multiplier disclosed in the Japanese Patent Disclosure No. 3-210683 (Application No. 2-5500) as any circuit as can be employed as above.

The three current mirror circuits to be disposed between the multiplier 2 and the inverter circuit 4 respectively operate to form a differential current of the differential output current outputted from the multiplier 2. For this, in the first current mirror circuit, the MOS transistor M1 has the drain connected to one output terminal of the multiplier 2 and the source connected to a voltage source VDD, and the MOS transistor M2 has the drain connected to the drain of the MOS transistor M5 of the third current mirror circuit and the source connected to the voltage source VDD. The gates of the transistor M1 and M2 of the first current mirror circuit are connected in common and connected through the connection point thereof to the drain of the transistor M1.

In the second current mirror circuit, the MOS transistor M3 has the drain connected to the other input terminal of the multiplier 2 and the source connected to the voltage source VDD, and the MOS transistor M4 has the drain connected to the drain of the MOS transistor M6 of the third current mirror circuit and the source connected to the voltage source VDD. The gates of the transistors M3 and M4 are connected in common and connected through the connection point thereof to the drain of the transistor M3.

In the third current mirror circuit, the MOS transistors M5 and M6 have their sources connected to the ground and the drains connected respectively to the drains of the transistors M2 and M4. The gates of the transistors M5 and M6 are connected in common and connected through the connection point thereof to the drain of the transistor M5.

In the inverter circuit 4, the p-channel MOS transistor M7 and the n-channel MOS transistor M8 are structured complimentarily to form a C-MOS circuit. That is, the drains of the transistors M7 and M8 are connected in common, the source of the transistor M7 is connected to the voltage source VDD, and the source of the transistor M8 is connected to the ground. The gates of the transistors M7 and M8 are connected in common thereby to receive a voltage from the connection point of the MOS transistors M4 and M6. An output signal of the inverter circuit 4 is sent through the connection point of the drains of the transistors M7 and M8 to the low-pass filter 5.

The low-pass filter 5 integrates an output signal of the inverter circuit 4 to remove the carrier component from the modulated IF signal. As a result, a demodulated signal can be outputted from the output terminal 6. As the low-pass filter 5, any type of it can be employed.

In this embodiment, the multiplier 2 receives a differential current through the MOS transistor M1 of the first current mirror circuit and the MOS transistor M3 of the second current mirror circuit. On the other hand, a differential current to be formed in the first and second current mirror circuits is sent out through the third current mirror circuit consisting of the MOS transistors M5 and M6 to the inverter circuit 4, or sent from the inverter circuit 4 through the third current mirror circuit to the multiplier 2.

With the frequency discriminator structured as above, the differential current formed by these current mirror circuits is sent to the MOS transistors M7 and M8 of the inverter circuit 4 through the connection point of the gates thereof, so that an input impedance of the inverter circuit 4 becomes extremely high, thus the load of these current mirror circuits being able to be made light. Accordingly, even when the operating current of the multiplier 2 is limited, the frequency characteristic thereof can be expanded. In this embodiment, the driving ability of a load is determined depending on the size of the MOS transistors M7 and M8, and, the low-pass filter 5 to be disposed next thereto is formed generally of an RC active filter in the case of being a C-MOS integrated circuit. Accordingly, such a level of resistance that is about 10K$\Omega$ can be set as the resistance load of the inverter circuit 4, which means that the load does not become so heavy.

In addition, the inverter circuit 4 can invert its output signal in response to the magnitude of the differential current outputted from the multiplier 2, that is, when the polarity of the differential current to be formed in the current mirror circuits is changed. As a result, the output signal of the inverter circuit 4 when the polarity of the differential current is changed becomes a rectangular wave whose amplitude is equal to that of the source voltage VDD. Accordingly, the load of the current mirror circuits can be made light and at the same time, by swinging the amplitude of the output signal of the inverter circuit 4 to the power source-to-ground voltage, the level of a signal to be supplied to the low-pass filter 5 can be increased. Accordingly, the level of a demodulated signal outputted from the low-pass filter 5 can be increased.

In addition, for example, in case that the duty of the rectangular wave of an output signal of the inverter circuit 4 is of the same, the output voltage of the inverter circuit 4 becomes VDD/2. This means that the direct-current operating point of the inverter circuit 4 can be uniquely determine by the duty of the rectangular wave thereof. As a result, the output signal of the inverter circuit 4 does not depend on the variation in circuit characteristic to be generated in the production process. In addition, even when the operating current of the multiplier 2 is varied due to change in ambient temperature thereby to vary the gain thereof, the inverter circuit 4 is driven by the differential current of the different output current of the multiplier 2, so that the effect of change in ambient temperature on the demodulated output signal will become small.

As explained above, the frequency discriminator of this embodiment can increase the signal level of a demodulated output, and decrease the variation of circuit characteristics to be generated in the production process and of the direct-current operating point due to variation in ambient temperature. This means that according to the first embodiment, a quadrature-type frequency discriminator which is superior in applicability can be realized on a C-MOS integrated circuit by arranging the phase shifter 3, multiplier 2 and low-pass filter 5 in the C-MOS structure.

Second Embodiment

Figure 2:
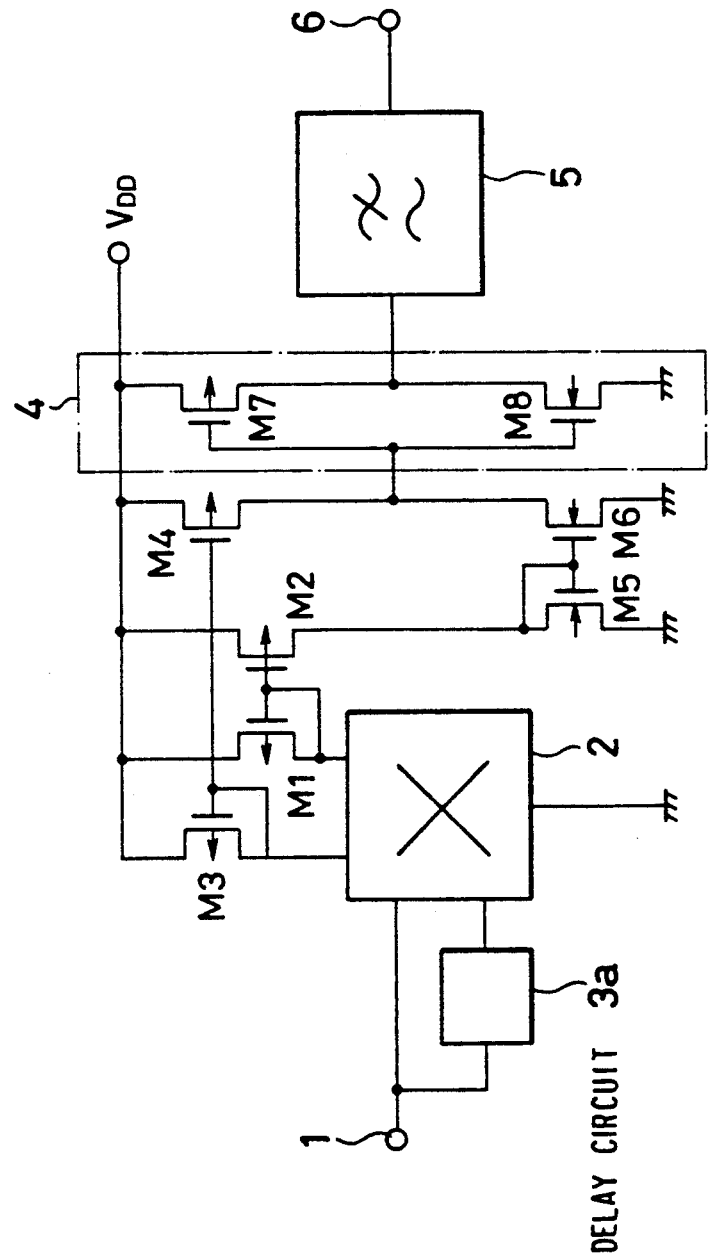
FIG. 2 is a circuit diagram of a frequency discriminator according to a second embodiment of this invention.

FIG. 2 is a circuit diagram of a frequency discriminator according to a second embodiment of this invention. The frequency discriminator of this embodiment has the same structure as that of the first embodiment excepting using a delay circuit 3a for delaying the phase of an input signal by a specific value independently of the frequency thereof instead of the phase shifter 3 in the first one.

The frequency discriminator of this embodiment exhibits the same effects as these of the first embodiment and further allows a multiplicative detector characteristic to be obtained.

As explained above, in the first and second embodiments, the current mirror circuits operate to form a differential current of the operating output current of the multiplier 2, but not limited thereby, any other circuit than the current mirror circuit can be employed for this purpose if it is operable as shown above.

What is claimed is:

1. A frequency discriminator comprising:
    a phase shifter for shifting a phase of a modulated signal;
    an analog multiplier for analogically multiplying said modulated signal and an output signal of said phase shifter and outputting the resultant signal thus multiplied as a differential output current;
    a circuit for forming a differential current of the differential output current outputted from said analog multiplier;
    an inverter circuit to be driven by said differential current; and
    a low-pass filter for integrating the output signal of said inverter circuit and removing the carrier component thereof.

2. A frequency discriminator as claimed in claim 1, wherein said circuit for forming a differential current of the differential output current of said multiplier is formed of a current mirror circuit.

3. A frequency discriminator as claimed in claim 2, wherein said circuit for forming said differential current comprises a first, second and third current mirror circuits, in which said multiplier receives or sends out an electric current through one of the transistors forming the first current mirror circuit and one of the transistors forming the second current mirror circuit through the first and second current mirror circuits, and yet a differential current formed by said circuit is sent through the third current mirror circuit to said inverter circuit or is sent from said inverter circuit through said third current mirror circuit to said multiplier.

4. A frequency discriminator as claimed in claim 1, wherein said inverter circuit has a C-MOS structure.

5. A frequency discriminator as claimed in claim 1, wherein said low-pass filter is formed of an RC active filter.

6. A frequency discriminator comprising:
    a delay circuit for delaying a phase of a modulated signal;
    an analog multiplier for analogically multiplying said modulated signal and an output signal of said delay circuit and outputting the resultant signal thus multiplied as a differential output current;
    a circuit for forming a differential current of a differential output current outputting from said multiplier;
    an inverter circuit to be driven by said differential current; and
    a low-pass filter for integrating an output signal of said inverter circuit and removing the carrier component thereof.

7. A frequency discriminator as claimed in claim 6, wherein said circuit for forming a differential current of a differential output current of said multiplier is formed of a current mirror circuit.

8. A frequency discriminator as claimed in claim 7, wherein said circuit for forming said differential current comprises a first, second and third current mirror circuits, in which said multiplier receives or sends out an electric current through one of the transistors forming the first current mirror circuit and one of the transistors forming the second current mirror circuit through the first and second current mirror circuits, and yet a differential current formed by said circuit is sent through the third current mirror circuit to said inverter circuit or is sent from said inverter circuit through said third current mirror circuit to said multiplier.

9. A frequency discriminator as claimed in claim 6, wherein said inverter circuit has a C-MOS structure.

10. A frequency discriminator as claimed in claim 6, wherein said low-pass filter is formed of an RC active filter.

* * * * *